United States Patent
Xue et al.

(10) Patent No.: US 9,912,301 B2
(45) Date of Patent: Mar. 6, 2018

(54) FACILITATION OF INCREASED BANDWIDTH FOR A LOW NOISE AMPLIFIER

(71) Applicant: City University of Hong Kong, Kowloon (HK)

(72) Inventors: Quan Xue, New Territories (HK); Pei Qin, Shenzhen (CN); Kam Man Shum, New Territories (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 0 days.

(21) Appl. No.: 15/096,740

(22) Filed: Apr. 12, 2016

(65) Prior Publication Data

US 2017/0294886 A1    Oct. 12, 2017

(51) Int. Cl.
*H03F 1/42* (2006.01)
*H03F 3/193* (2006.01)
*H03F 1/56* (2006.01)

(52) U.S. Cl.
CPC .............. *H03F 1/42* (2013.01); *H03F 1/565* (2013.01); *H03F 3/193* (2013.01); *H03F 2200/225* (2013.01); *H03F 2200/294* (2013.01); *H03F 2200/451* (2013.01); *H03F 2200/541* (2013.01)

(58) Field of Classification Search
USPC .................. 330/277, 311, 306, 188, 195
See application file for complete search history.

(56) References Cited

U.S. PATENT DOCUMENTS 5,015,968 A * 5/1991 Podell .................... H03F 1/226
                                              330/277
2016/0322939 A1* 11/2016 Liu ....................... H03F 1/0261

OTHER PUBLICATIONS

Kam et al., "A Wideband Distributed Amplifier Employing an Envelop Tracking Technique," IEEE Microwave and Wireless Components Letters, Jun. 2013, vol. 23, No. 6, IEEE, 3 pages.
Kim et al., "A 92 GHz Bandwidth Distributed Amplifier in a 45 nm SOI CMOS Technology," IEEE Microwave and Wireless Components Letters, Jun. 2011, pp. 329-331, vol. 21, No. 6, IEEE.
Shim et al., "Design of Full Band UWB Common-Gate LNA," IEEE Microwave and Wireless Components Letters, Oct. 2007, pp. 721-723, vol. 17, No. 10, IEEE.
(Continued)

*Primary Examiner* — Hieu Nguyen
(74) *Attorney, Agent, or Firm* — Amin, Turocy & Watson, LLP

(57) ABSTRACT

Amplifiers can be used for a variety of electronic-based applications. Therefore, amplifier performance is of importance. A low noise amplifier can be interfaced after an antenna or a band-select filter as a first active stage, in a receiver since its bandwidth characteristics can be closely related to a system data rate. A bandwidth enhancement technique can be leverage for low noise amplifiers by embedding a transformer between a gate and a drain terminal of a common gate transistor in a cascode topology. The embedded transformer can introduce an additional high-frequency conjugate zero pair, which can push the gain rolling-off start-up point to a higher frequency, peak the higher frequency gain, and broaden the low noise amplifier gain bandwidth.

20 Claims, 11 Drawing Sheets

(56) References Cited

OTHER PUBLICATIONS

Kim et al., "Wideband Common-Gate CMOS LNA Employing Dual Negative Feedback with Simultaneous Noise, Gain, and Bandwidth Optimization," IEEE Transactions on Microwave Theory and Techniques, Sep. 2010, pp. 2340-2351, vol. 58, No. 9, IEEE.

Feng et al., "3-10 GHz Self-Biased Resistive-Feedback LNA with Inductive Source Degeneration", Electronic Letters, Mar. 2013, vol. 49, No. 6, IEEE, 2 pages.

Wang et al., "0.6-3-GHz Wideband Receiver RF Front-End With a Feedforward Noise and Distortion Cancellation Resistive-Feedback LNA," IEEE Transactions on Microwave Theory and Techniques, Feb. 2012, pp. 387-392, vol. 60, No. 2, IEEE.

Ismail et al., "A 3-10-GHz Low-Noise Amplifier With Wideband LC-Ladder Matching Network," IEEE Journal of Solid-State Circuits, Dec. 2004, pp. 2269-2277, vol. 39, No. 12, IEEE.

* cited by examiner

FACILITATION OF INCREASED BANDWIDTH FOR A LOW NOISE AMPLIFIER

TECHNICAL FIELD

This disclosure relates generally to amplifiers. More specifically, this disclosure relates to bandwidth enhancement to peak a high-frequency gain of a low noise amplifier resulting in a wideband gain response.

BACKGROUND

An amplifier is an electronic device that can increase the power of a signal by taking energy from a power supply and controlling the output to match the input signal shape but with a larger amplitude. In this sense, an amplifier can modulate the output of the power supply to make the output signal stronger than the input signal. An amplifier is effectively the opposite of an attenuator: while an amplifier provides gain, an attenuator provides loss.

An amplifier can either be a separate piece of equipment or an electrical circuit within another device. The ability to amplify is fundamental to modern electronics, and amplifiers are widely used in electronic equipment. The types of amplifiers can be categorized in different ways. One is by the frequency of the electronic signal being amplified: audio amplifiers can amplify signals in the audio (sound) range of less than 20 kHz, and radio frequency (RF) amplifiers can amplify frequencies in the radio frequency range between 20 kHz and 300 GHz. Another consideration is which quantity, voltage or current, is being amplified. Therefore, amplifiers can be divided into voltage amplifiers, circuit amplifiers, transconductance amplifiers, and transresistance amplifiers.

A transistor is a semiconductor device used to amplify and switch electronic signals and electrical power. It is composed of semiconductor material with at least three terminals for connection to an external circuit. A voltage or current applied to one pair of the transistor's terminals changes the current through another pair of terminals. Because the controlled (output) power can be higher than the controlling (input) power, a transistor can amplify a signal. Some transistors are packaged individually, but many are found embedded in integrated circuits.

Transistors are utilized for their ability to use a small signal applied between one pair of its terminals to control a much larger signal at another pair of terminals. This property is called gain. It can produce a stronger output signal, a voltage, or current, which is proportional to a weaker input signal; that is, it can act as an amplifier. Alternatively, the transistor can be used to turn current on or off in a circuit as an electrically controlled switch, where the amount of current is determined by other circuit elements.

The above-described background relating to amplifiers is merely intended to provide a contextual overview of transistors, and is not intended to be exhaustive. Other context regarding amplifiers may become further apparent upon review of the following summary and detailed description.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the purpose of this summary is to present some concepts related to some exemplary non-limiting embodiments in simplified form as a prelude to more detailed description of the various embodiments that follow in the disclosure.

The objective of the disclosure is to develop a wideband RF circuit design. A low noise amplifier can be interfaced after an antenna or a band-select filter as a first active stage, in a receiver since its bandwidth characteristics can be closely related to a system data rate. Common topologies leverage distributed amplifiers, common gate amplifiers, and resistive shunt-feedback amplifiers to accomplish wide bandwidth for low noise amplifiers. However, these approaches are limited because of drawbacks such as large chip size, high DC power consumption, unsatisfactory noise figures and insufficient gains. In view of these deficiencies for wideband low noise amplifiers, the present disclosure provides an efficient transformer-peaking bandwidth enhancement technique to extend the conventional source-degenerated cascode low noise amplifier into wide bandwidth by embedding a transformer between a gate and a drain terminal of a common gate transistor. The embedded transformer can introduce an additional high-frequency conjugate pole pair, which can push the gain rolling-off start-up point to a higher frequency, peak the higher frequency gain, and hence broaden the amplifier gain bandwidth.

Furthermore, there are two types of transistors, which have slight differences in how they are used in a circuit. A bipolar transistor has terminals labeled base, collector, and emitter. A small current at the base terminal (that is, flowing between the base and the emitter) can control or switch a much larger current between the collector and emitter terminals. For a field-effect transistor (FET), the terminals are labeled gate, source, and drain, and a voltage at the gate can control a current between source and drain. Therefore, it should be noted that the disclosed method and apparatuses are not limited to complimentary metal-oxide semiconductor (CMOS) devices; any other semiconductor fabrication process such as bipolar can also be applied.

Low noise amplifiers have been used in many applications such as wireless networks, satellite communication, and mobile communication systems. They can play a key role in the receiver performance. The current disclosure comprises a low noise amplifier which adopts an on-chip transformer embedded between its drain and gate terminals of the common gate transistor in a cascode topology. Cascode amplifiers have been widely utilized because of their competitive advantages including reverse isolation and higher gain. However, without employing an additional bandwidth enhancement technique, cascode amplifiers can exhibit a narrowband response because of its input and output inductance capacitance (LC) resonant networks. This disclosure presents a bandwidth enhancement technique to peak the high-frequency gain of the cascode low noise amplifier to obtain a wideband gain response. Consequently, the rolling-off frequency can be pushed to a higher frequency, effectively enhancing the bandwidth, and the accompanied fast gain rolling-off outside the desired band can help reject interference. Furthermore, this technique can shrink two inductors into one stacked transformer, introducing one extra degree of freedom (coupling factor: M) for the design, and saving expensive chip area for engineering applications.

It should be noted that the current disclosure is not limited by only one cascode stage. Any other amplifiers with multiple cascading stages employing the proposed transformer-based bandwidth technique can also be used. The transformer-based bandwidth technique of claim can also be applied to buffer amplifiers, mixer amplifiers, and/or power amplifiers used in wideband applications.

Described herein are systems, methods, articles of manufacture, and other embodiments or implementations that can facilitate the increase of bandwidth for amplifiers and can be implemented in connection with any type of radio, telecommunications, satellite, computer, and other electronic applications device.

According to one embodiment, described herein is an apparatus with increased amplifier bandwidth. The apparatus can comprise a first transistor, comprising a first gate, a first drain terminal, and a first source terminal; a second transistor, comprising a second gate, a second drain terminal, and a second source terminal; and a transformer.

According to yet another embodiment, described herein is an apparatus with increased amplifier bandwidth. The apparatus can comprise a first inductor, a capacitor, wherein the first inductor and the capacitor are in parallel resulting in an inductance capacitance pair. The apparatus can also comprise a first transistor, a second transistor, and a transformer.

According to yet another embodiment, described herein is a method for making a wideband low noise amplifier. The method can comprise forming a first transistor comprising a first gate, a first source terminal, and a first drain terminal; forming a second transistor comprising a second gate, a second source terminal, and a second drain terminal; and embedding a transformer between the second gate and the second drain terminal.

These and other embodiments or implementations are described in more detail below with reference to the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
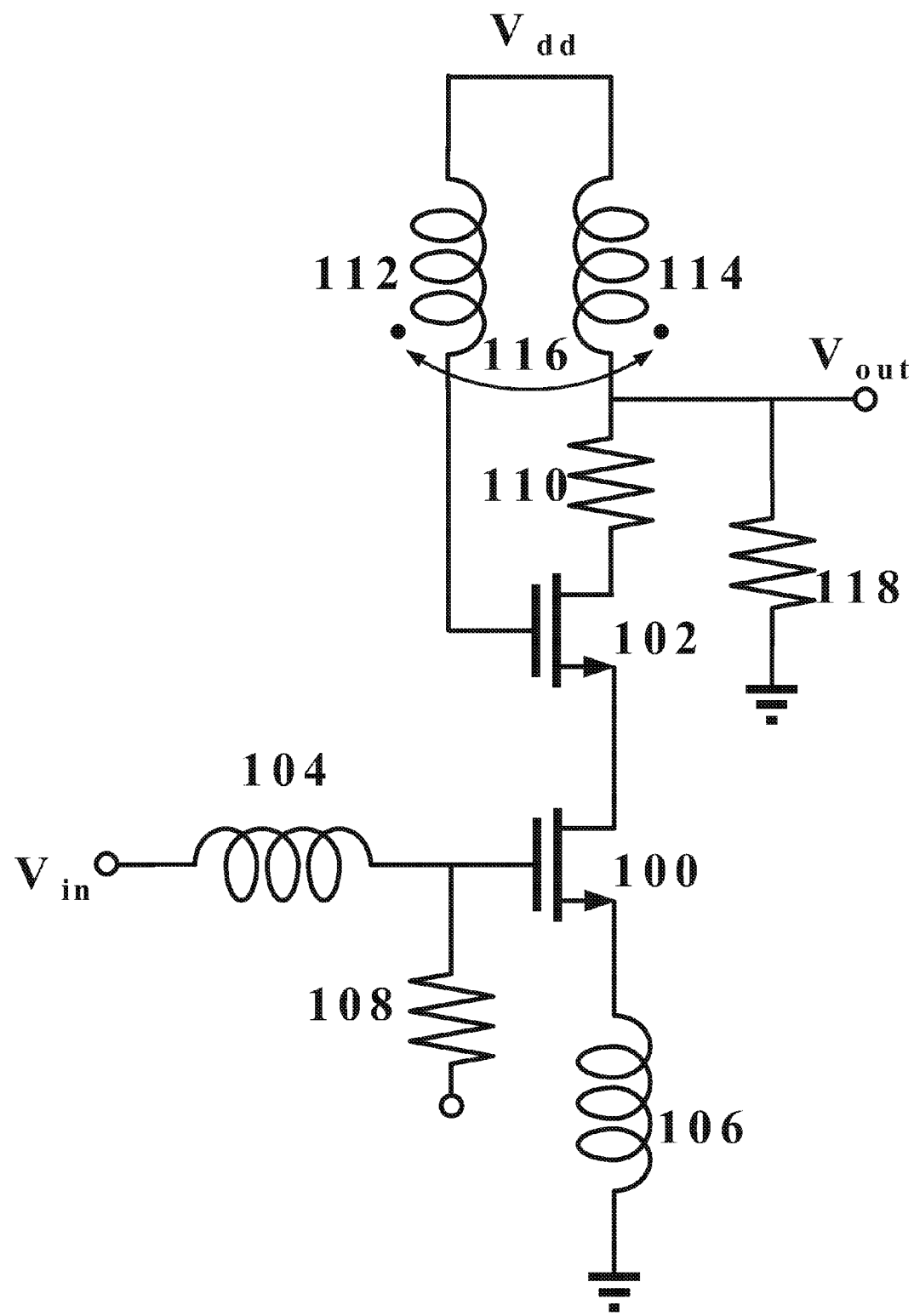
FIG. 1 illustrates an example amplifier circuit schematic with transformer peaking.

In the following description, numerous specific details are set forth to provide a thorough understanding of various embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in one or more embodiments.

As utilized herein, terms "component," "system," "interface," and the like are intended to refer to a computer-related entity, hardware, software (e.g., in execution), and/or firmware. For example, a component can be a processor, a process running on a processor, an object, an executable, a program, a storage device, and/or a computer. By way of illustration, an application running on a server and the server can be a component. One or more components can reside within a process, and a component can be localized on one computer and/or distributed between two or more computers.

Further, these components can execute from various computer readable media having various data structures stored thereon. The components can communicate via local and/or remote processes such as in accordance with a signal having one or more data packets (e.g., data from one component interacting with another component in a local system, distributed system, and/or across a network, e.g., the Internet, a local area network, a wide area network, etc. with other systems via the signal).

As another example, a component can be an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components. In an aspect, a component can emulate an electronic component via a virtual machine, e.g., within a cloud computing system.

The words "exemplary" and/or "demonstrative" are used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

As used herein, the term "infer" or "inference" refers generally to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference can be employed to identify a specific context or action, or can generate a probability distribution over states of interest based on a consideration of data and events, for example.

Inference can also refer to techniques employed for composing higher-level events from a set of events and/or data. Such inference results in the construction of new events or actions from a set of observed events and/or stored event data, whether the events are correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

In addition, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can include, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media.

As an overview of the various embodiments presented herein, to correct for the above-identified deficiencies and other drawbacks of conventional low noise amplifiers, a bandwidth enhancement technique is presented herein to peak a high-frequency gain.

FIGS. 1-11 illustrate apparatuses and methods that can increase low noise amplifier performance by peaking the high-frequency gain. For simplicity of explanation, the methods (or algorithms) are depicted and described as a series of acts. It is to be understood and appreciated that the various embodiments are not limited by the acts illustrated and/or by the order of acts. For example, acts can occur in various orders and/or concurrently, and with other acts not presented or described herein. Furthermore, not all illustrated acts may be required to implement the methods. In addition, the methods could alternatively be represented as a series of interrelated states via a state diagram or events. Additionally, the methods described hereafter are capable of being stored on an article of manufacture (e.g., a computer readable storage medium) to facilitate transporting and transferring such methodologies to computers. The term article of manufacture, as used herein, is intended to encompass a computer program accessible from any computer-readable device, carrier, or media, including a non-transitory computer readable storage medium.

Referring now to FIG. 1, illustrated is an example amplifier circuit schematic with transformer-peaking technique to peak the high frequency gain. The amplifier circuit schematic can comprise two cascode FETs 100, 102. The FET 100 can work as a voltage-current converter, which exhibits a proper trans-conductance for signal amplification. The FET 102 can eliminate the miller capacitance and provide a high output impedance at the output terminal, thus contributing to a reverse isolation and a higher gain. A transformer comprising inductors 112, 114, 116 embedded between the gate and drain terminals of the FET 102 shown in FIG. 1 can be used to peak the gain response, thus broadening the gain bandwidth.

The inductively-degenerated common source can be realized by the FET 100 and inductors 104, 106. Carefully selecting the inductors 104, 106 could cancel a gate-source capacitance $C_{gs}$ from the FET 100 and realize a real impedance part matched to 50Ω (ohms) in the narrowband. A gate voltage of a common source transistor can be biased by a resistor 108. An on-chip transformer can be composed of inductors 112, 114, and a mutual inductance 116. As a passive component, the on-chip transformer can supply a common-gate bias voltage. Another resistor 110 can connect between the on-chip transformer and the common gate drain terminal of the FET 102 effectively eliminating possible instability.

Figure 2:
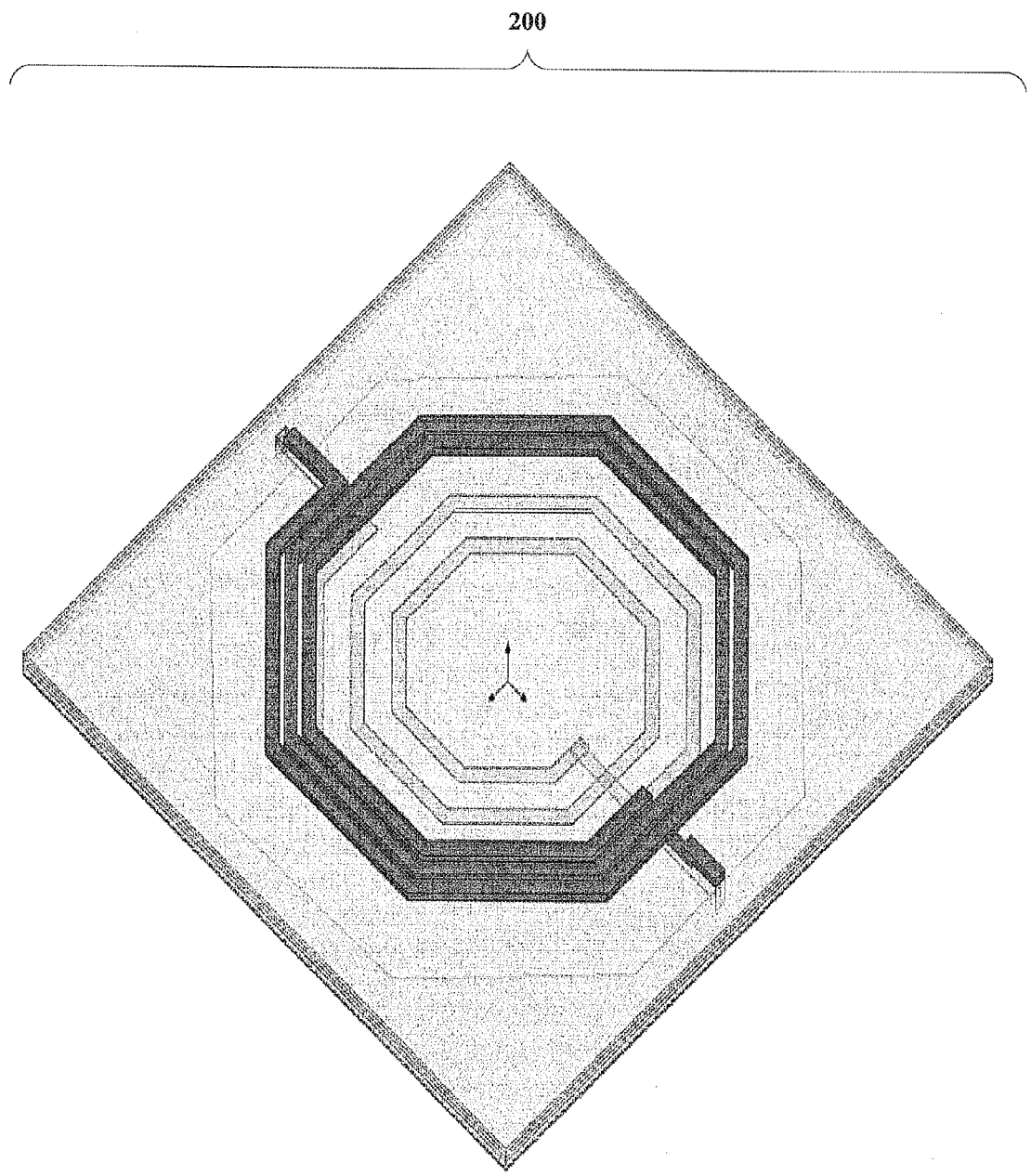
FIG. 2 illustrates an example schematic of a geometry of an on-chip transformer.

Referring now to FIG. 2, illustrated is an example schematic of a geometry of an on-chip transformer. The on-chip transformer can be composed of inductors 112, 114, and a mutual inductance 116 can be designed by stacking two coils on a top and a sub-top metal layer in a CMOS process 200 as shown in the geometry of FIG. 2.

Figure 3:
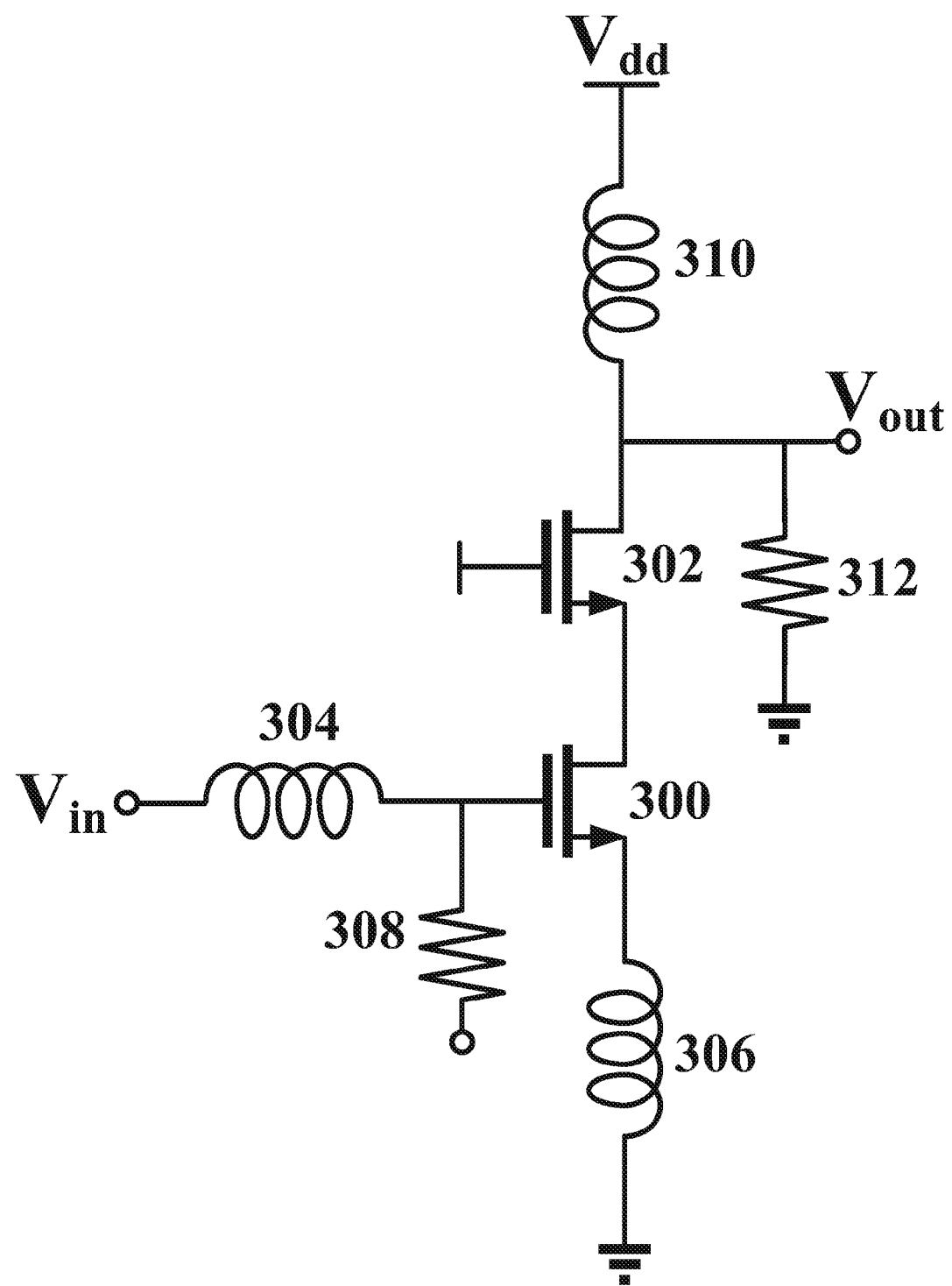
FIG. 3 illustrates an example schematic of an inductive-peaking cascode low noise amplifier.

Referring now to FIG. 3, illustrated is an example schematic of an inductive-peaking cascode low noise amplifier. The output voltage $V_{out}$ can lay between an inductor 310 and a drain terminal of FET 302. The resistor 312 can lay between the inductor 310, the drain terminal of FET 302, a ground, and the output $V_{out}$. Another drain terminal of FET 300 can be connected to the source terminal of FET 302. The source terminal of FET 300 can lead to another inductor 306, which then connects to another ground. The gate of FET 300 can be connected to a resistor 308 and inductor 304. The inductor 304 is also connected to an input voltage $V_{in}$.

Figure 4:
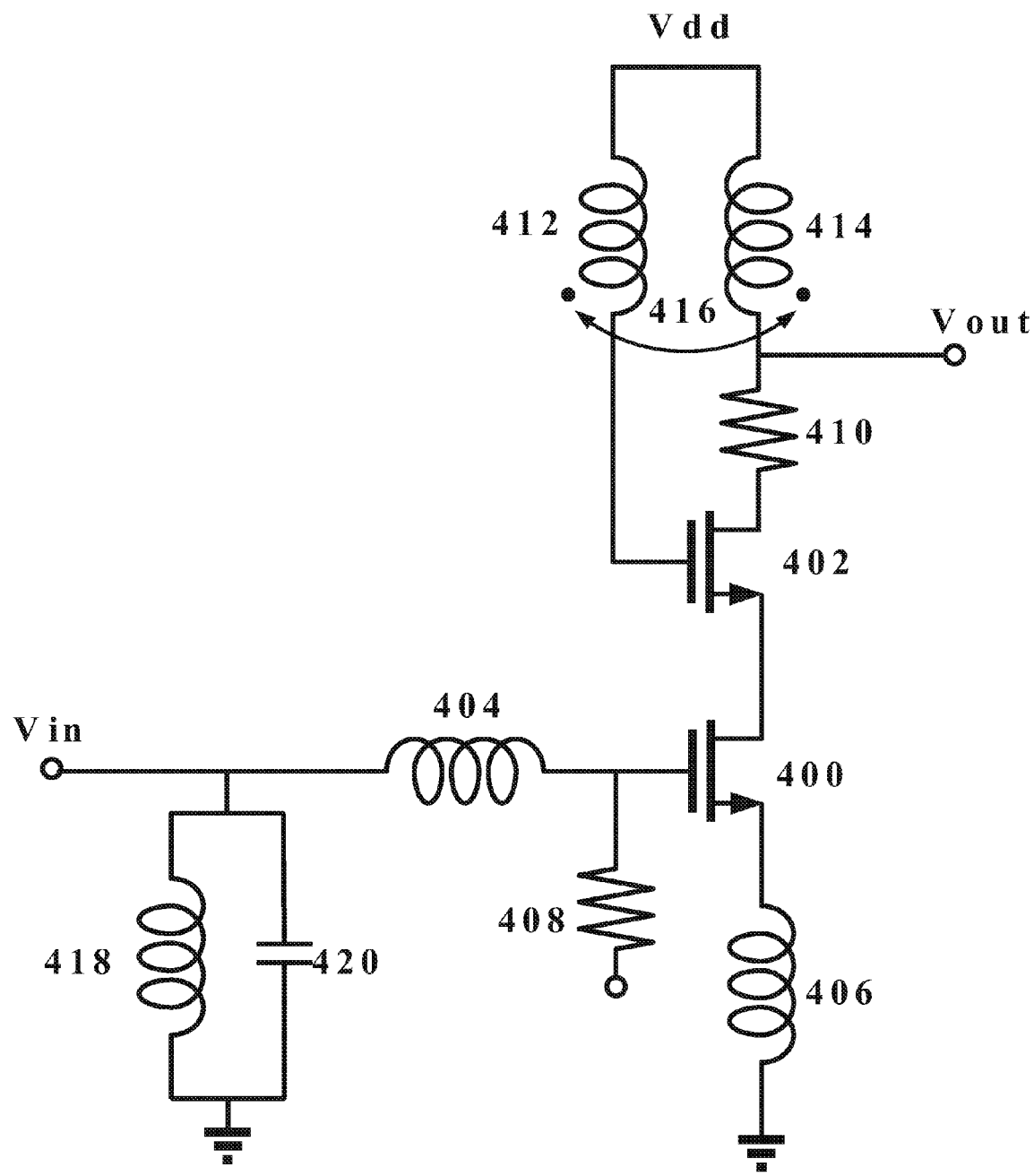
FIG. 4 illustrates an example schematic of a wideband low noise amplifier with wideband gain response and input matching using transformer peaking and LC input matching network.

Referring now to FIG. 4, illustrated is an example schematic of a wideband low noise amplifier with both wideband gain response by the proposed transformer-peaking technique and wideband input matching by LC input matching network. The transformer-peaking technique broadens the gain bandwidth, and has negligible effects on the input matching in the desired band due to the good isolation of cascode topology. FIG. 1 exhibits a wideband gain response with a narrowband input matching. To achieve a viable low noise amplifier in wideband applications, a low noise amplifier can possess both wideband input matching and wideband gain response. A parallel LC pair can be shunted at the input node as a bandpass filter to form two resonant points at low and high frequency to realize a wideband input matching performance.

Figure 6:
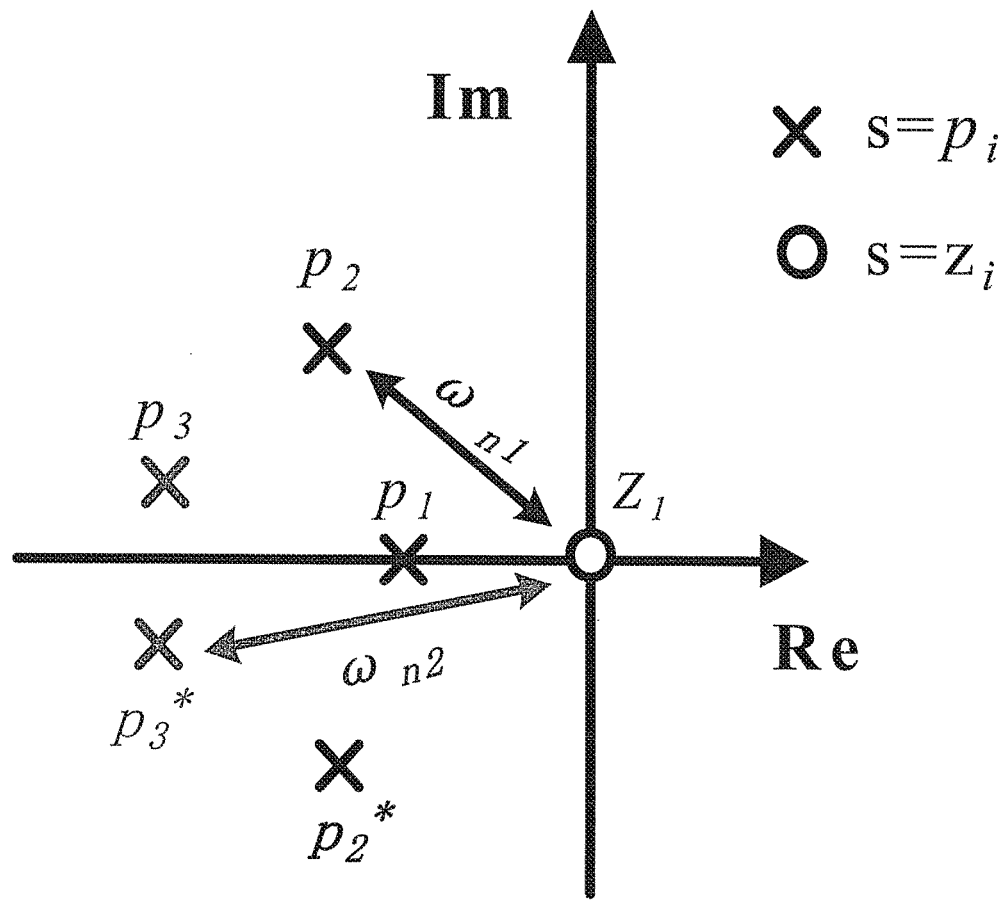
FIG. 6 illustrates an example schematic of poles and zeros in an s-plane of the low noise amplifier with transformer peaking.
Figure 7:
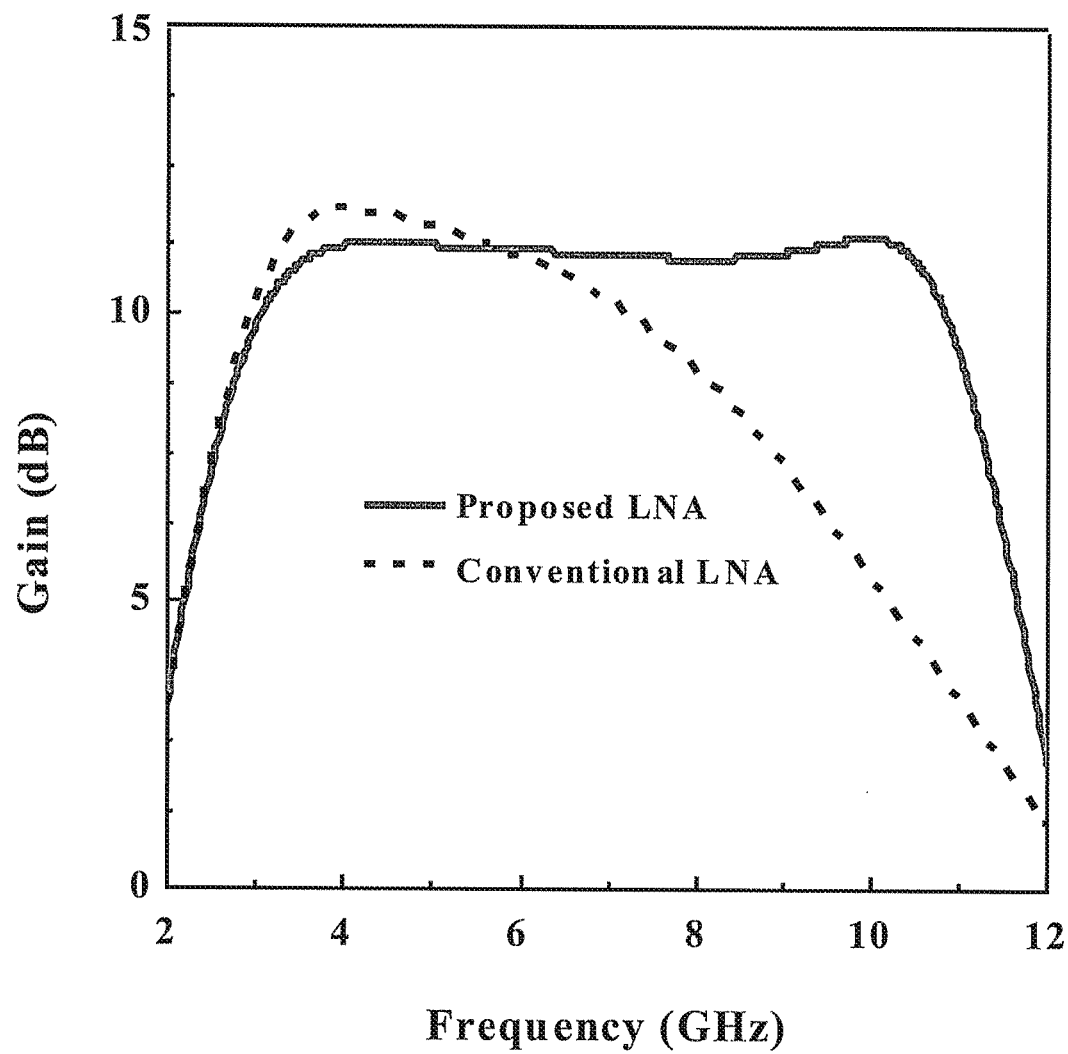
FIG. 7 illustrates an example schematic simulated bandwidth comparison of the low noise amplifier with transformer peaking in FIG. 1 and inductive peaking in FIG. 3.

Combining the transformer-peaking technique in FIG. 1 and a parallel shunt LC pair at input node can yield the low noise amplifier with wideband gain response and wideband input matching of FIG. 4. The amplifier circuit schematic can comprise two cascaded FETs 400, 402. The FET 400 can work as a voltage-current converter, which exhibits a proper trans-conductance for signal amplification. The FET 402 can eliminate the miller capacitance and provide a higher output impedance at the output terminal, thus contributing to a higher reverse isolation and a higher gain. Embedding between the gate and drain terminals of a common gate transistor, the transformers 412 414, 416 can generate a new conjugate pole pair performing at slight damping, peaking the high frequency gain as shown in FIG. 6 and FIG. 7. Shunting, at the input node $V_{in}$, a parallel LC circuit comprised of the inductor 418 and the capacitor 420 can generate wideband input matching as shown in FIG. 5.

The inductively-degenerated common source can be realized by the FET 400 and inductors 404, 406. Carefully selecting the inductors 404, 406 could cancel a gate-source capacitance $C_{gs}$ from the FET 400 and produce a real impedance part matched to 50 Ω (ohms) in the narrowband, equivalent to a series resistance (R)LC network. A parallel LC pair 418, 420 can be shunted ahead of the series RLC forming two resonant points at low and high frequency to realize a wideband input matching performance. A gate voltage of a common source transistor can be biased by a resistor 408. An on-chip transformer can be composed of inductors 412, 414, and a mutual inductance 416. As a passive component, the on-chip transformer can supply a common-gate bias voltage. Another resistor 410 can connect between the on-chip transformer and the common gate drain terminal of the FET 402 effectively eliminating possible instability. The output voltage $V_{out}$ can lay between the resistor 410 and the inductor 414.

Figure 5:
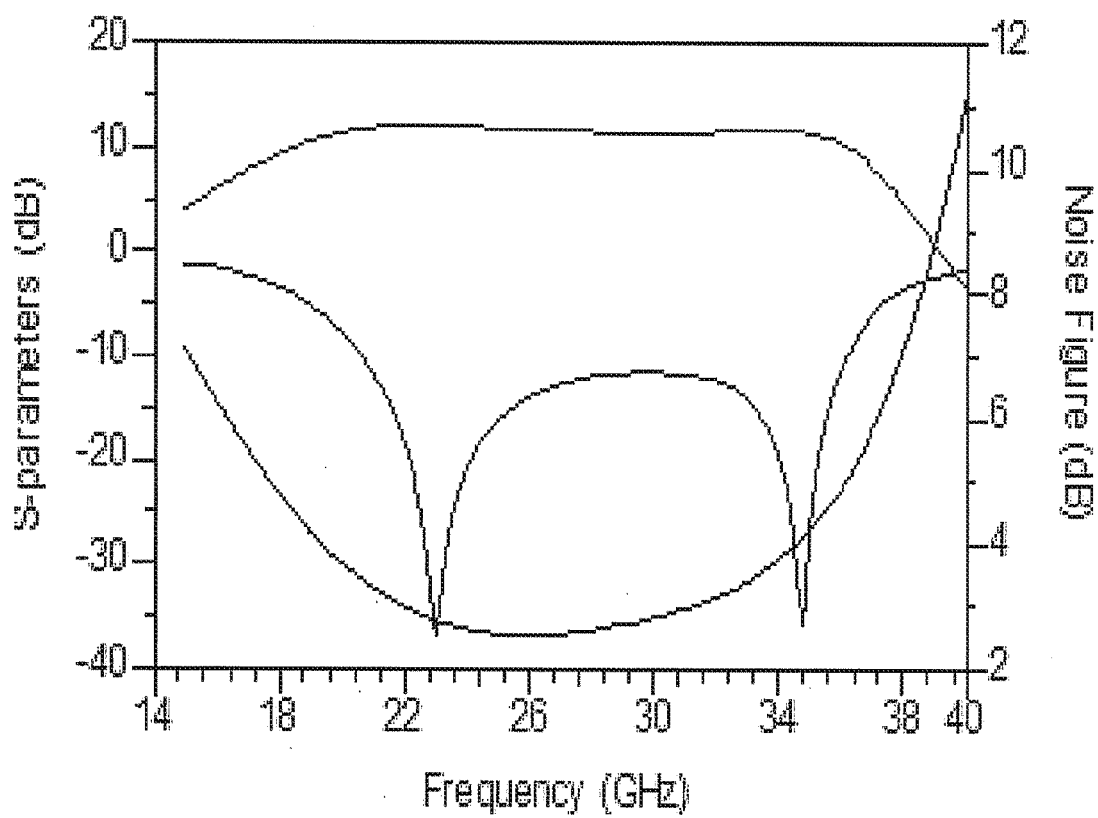
FIG. 5 illustrates an example simulated S-parameters graph of FIG. 4.

Referring now to FIG. 5, illustrated is an example simulated S-parameters graph of the low noise amplifier shown in FIG. 4 in a Taiwan Semiconductor Manufacturing Company (TSMC) a 65 nanometer (nm) radio frequency (RF) CMOS process. With the transformer inserted and parallel LC shunted at the input node, the low noise amplifier can achieve both wideband gain and input matching from 20 GHz to 36 GHz.

Referring now to FIG. 6, illustrated is an example schematic of poles and zeros in an s-plane of the low noise amplifier with transformer peaking. Embedding the on-chip transformer between the gate and drain terminals can construct an extra conjugate pole pair in the left-half s-plane to push the gain rolling-off start-up frequency to a higher frequency point. Without the transformer peaking, the conventional drain inductive-peaking low noise amplifier only has one single pole (s=p1) and one conjugate pole pair (s=p2−p2*), and it normally exhibits narrow band gain response with its bandwidth dominated by the damping performance from the conjugate pole pair. After adopting the transformer-peaking, it can introduce one new conjugate pole pair, namely p3 and p3*. By appropriately designing the transformer parameters (inductors 412, 414 and mutual inductance 416) p3 and p3* can appear at frequency ωn2 higher than ωn1, and the forming second conjugate pole pair can generate a slight damping, compensating the gain rolling-off from the first pole pair and peaking the high frequency gain. In addition, p3−p3* can generate a fast gain rolling-off outside the desired band, which could help reject interference and jamming signals.

Referring now to FIG. 7, illustrated is an example schematic simulated bandwidth enhancement of the low noise amplifier with transformer peaking. The proposed low noise amplifier can exhibit a broadened bandwidth compared to the conventional drain inductive-peaking cascode low noise amplifier. The transformer can be equivalent to three inductors in a T-shape, with two self-inductances and a mutual inductance. Without considering the body effect and channel length modulation effects, the proposed low noise amplifier topology can have one zero (s=z1), one single pole (s=p1), and two conjugate pole pairs (s=p2−p2*, p3−p3*) appearing in the operating band in sequence as z1, p1, p2−p2*, and p3−p3*, as shown in FIG. 6. Consequently, the gain can increase from low frequency (z1), flattens at the first pole (p1), and then meets the two conjugate pole pairs, exhibiting a flat gain response with proper damping performance.

Figure 8:
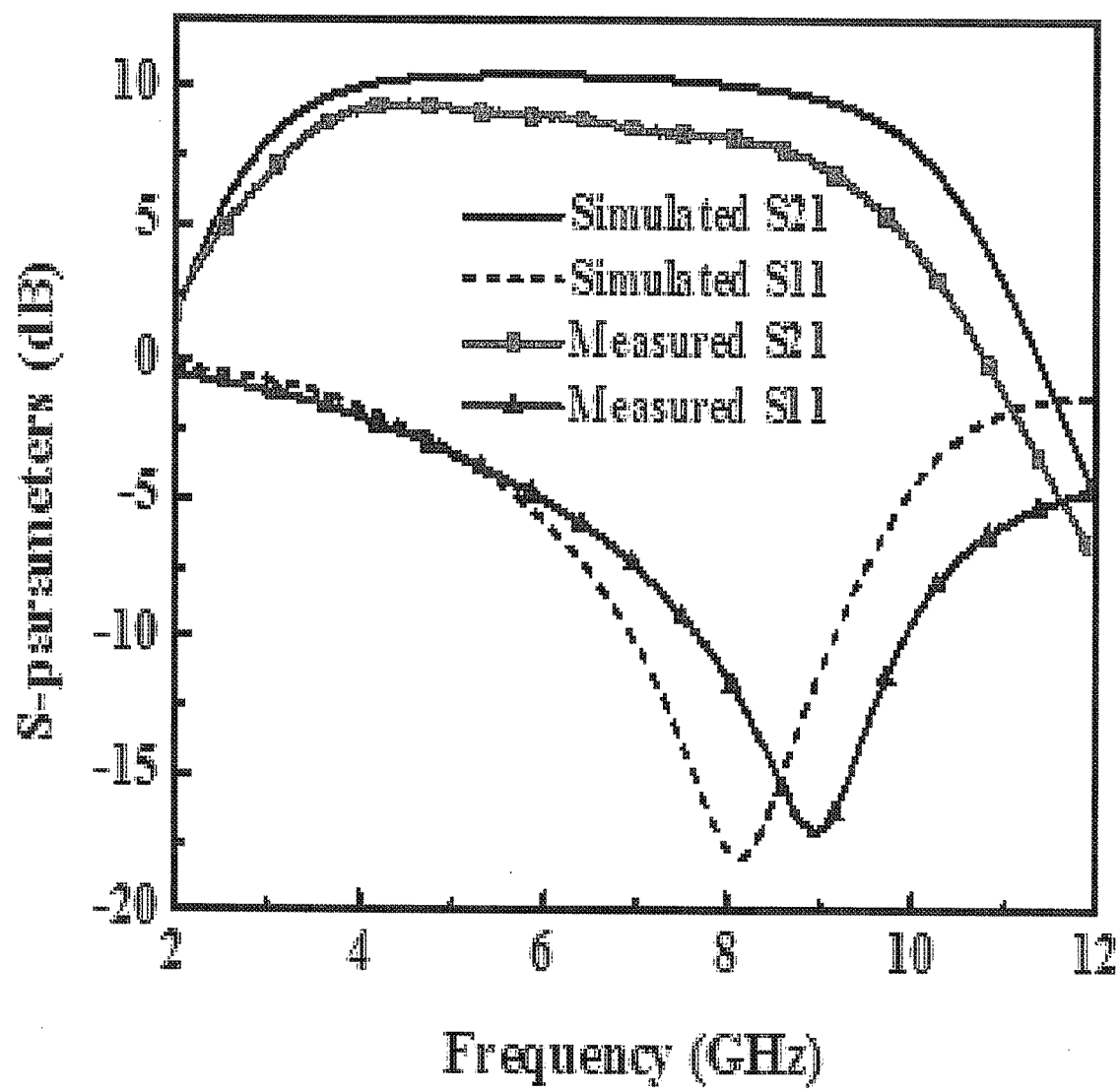
FIG. 8 illustrates an example schematic of post-layout simulated and measured s-parameters of the low noise amplifier with transformer peaking.
Figure 9:
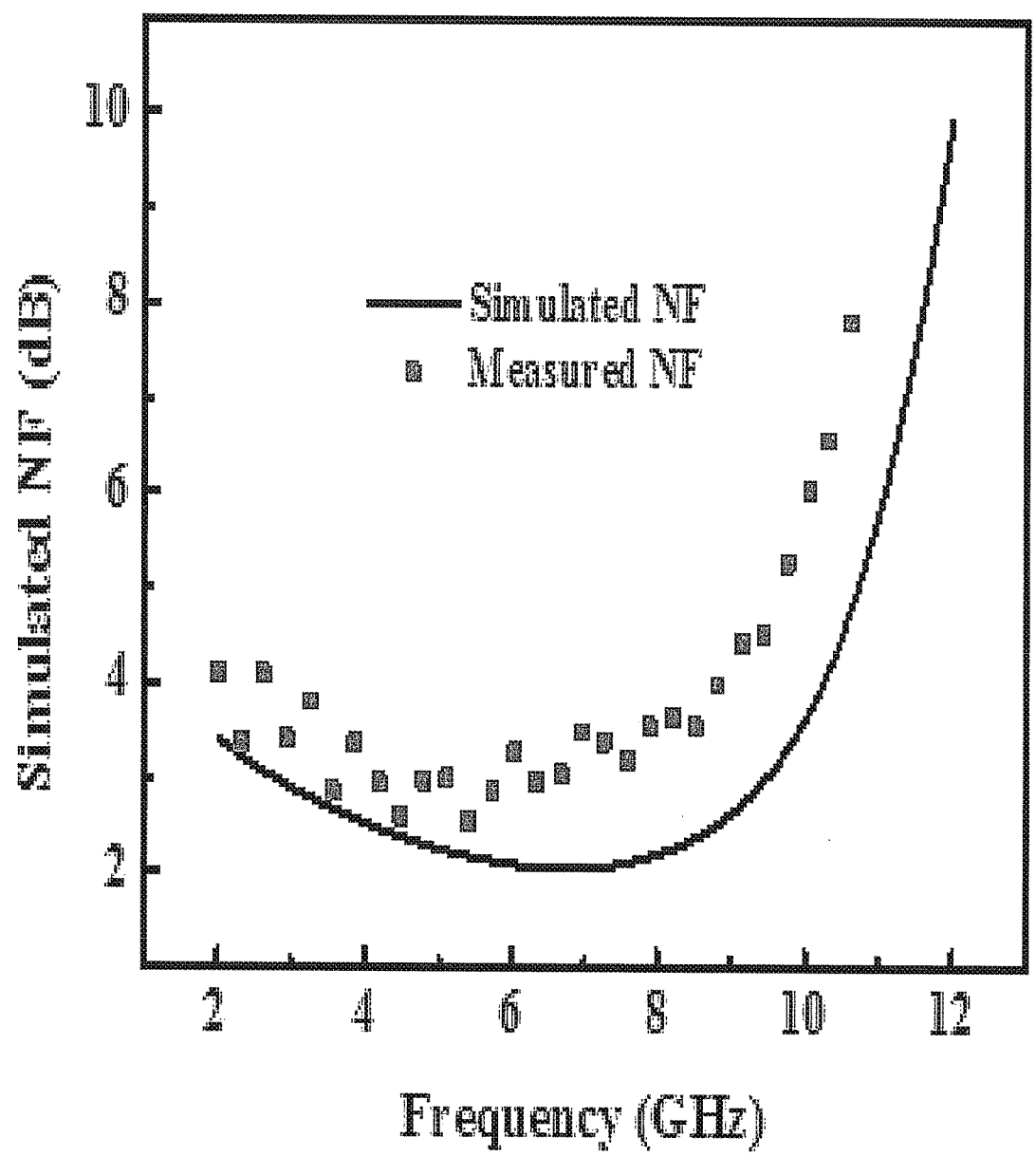
FIG. 9 illustrates an example schematic of post-layout simulated and measured noise figures of the low noise amplifier with transformer peaking.
Figure 10:
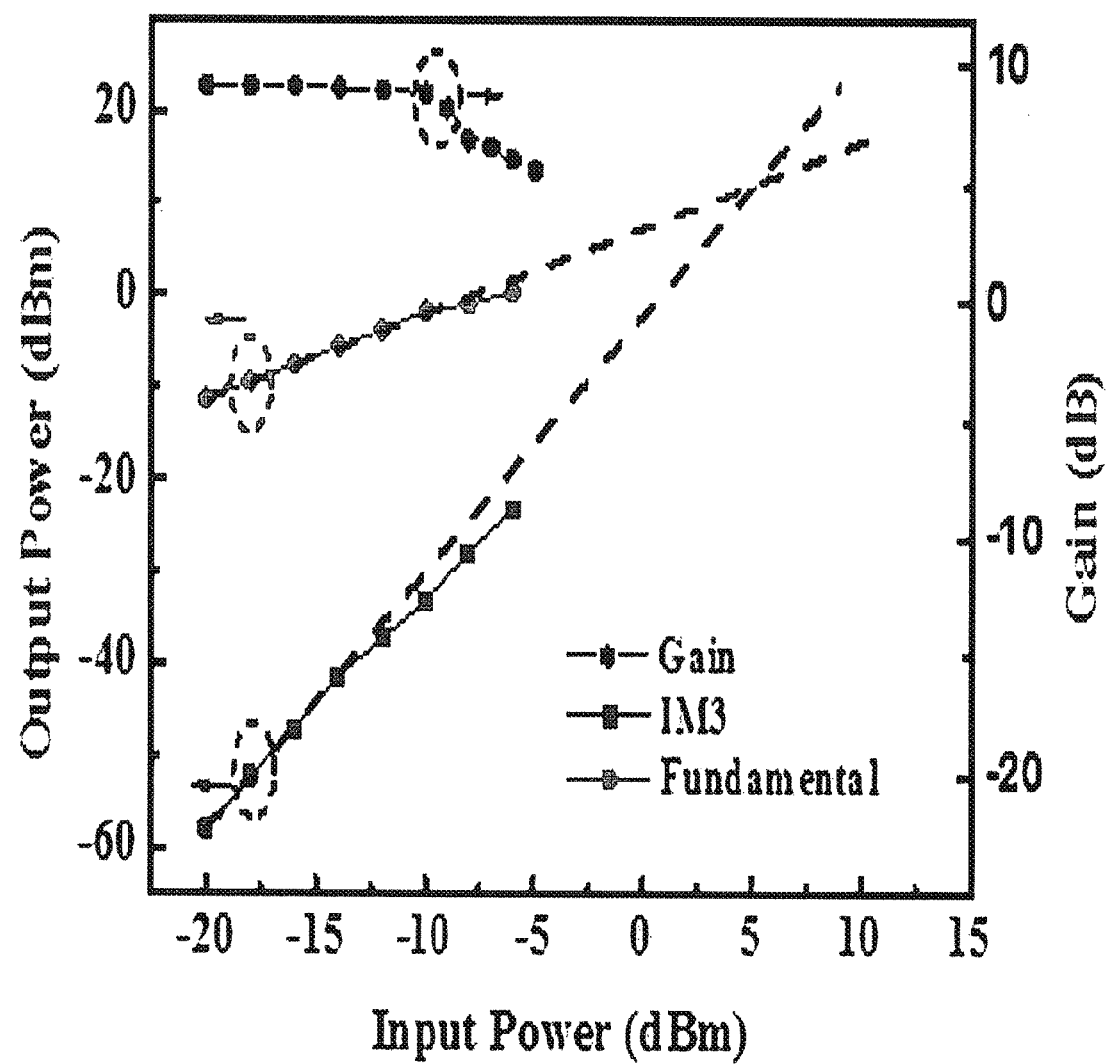
FIG. 10 illustrates an example schematic of a measured input 1 dB compression point and an input third-order intercept point of the low noise amplifier with transformer peaking.

Referring now to FIGS. 8-10, to verify the design concept of the proposed transformer peaking technique, a low noise amplifier was implemented in a TSMC a 0.18 μm RF CMOS process with the overall chip size including direct current (DC) and RF pads of 690 μm×550 μm. The measurement was carried out by on-wafer probe testing for validation of the design concept. The on-chip transformer fabricated by the top and sub-top metal layers occupying a chip size the same as its self-inductance, was simulated by and electromagnetic (EM) simulation method.

Referring now to FIG. 8, illustrated is an example schematic of post-layout simulated and measured s-parameters of the low noise amplifier with transformer peaking. After introducing the transformer inserted between the gate and the drain terminals of the common gate transistor, the low noise amplifier can exhibit a wide bandwidth (3-10 GHz) and a flat gain response. The rolling-off start-up frequency of the cascode low noise amplifier can be pushed from approximately 6 GHz to 10 GHz by using the proposed technique. Thus, the 3 dB bandwidth of the cascode low noise amplifier can be effectively broadened. The measured peak gain of the low noise amplifier is 9.4 dB, with 3 dB BW ranging from 2.9 GHz to 9.4 GHz, which agrees with the simulated result. The measurements exhibit S11<−15 dB at frequency of 8 GHz. The proposed technique can negligibly affect the input impedance and the noise figure in the desired band due to the isolation of the cascode topology.

Referring now to FIG. 9, illustrated is an example schematic of post-layout simulated and measured noise figures of the low noise amplifier with transformer peaking. The simulated and measured noise figures can be compared, exhibiting 2 dB and 2.7 dB minimum noise figures, respectively. The measured noise figure can obtain an average 3 dB over the frequency band of interest.

Referring now to FIG. 10, illustrated is an example schematic of a measured input 1 dB compression point and an input third-order intercept point of the low noise amplifier with transformer peaking. The input 1 dB compression point can reached −9 dBm at 5 GHz. The two-tone tests (with 1 MHz frequency separation) can be conducted at 5 GHz to characterize input third-order intercept point. The disclosed low noise amplifier can achieve the input third-order intercept point of 4 dBm as shown in FIG. 10. The fabricated low noise amplifier adopting the transformer-peaking technique can exhibit a broadened bandwidth at high frequency, maintain a good noise figure, input third-order intercept point performance, and leverage a compact chip size.

Figure 11:
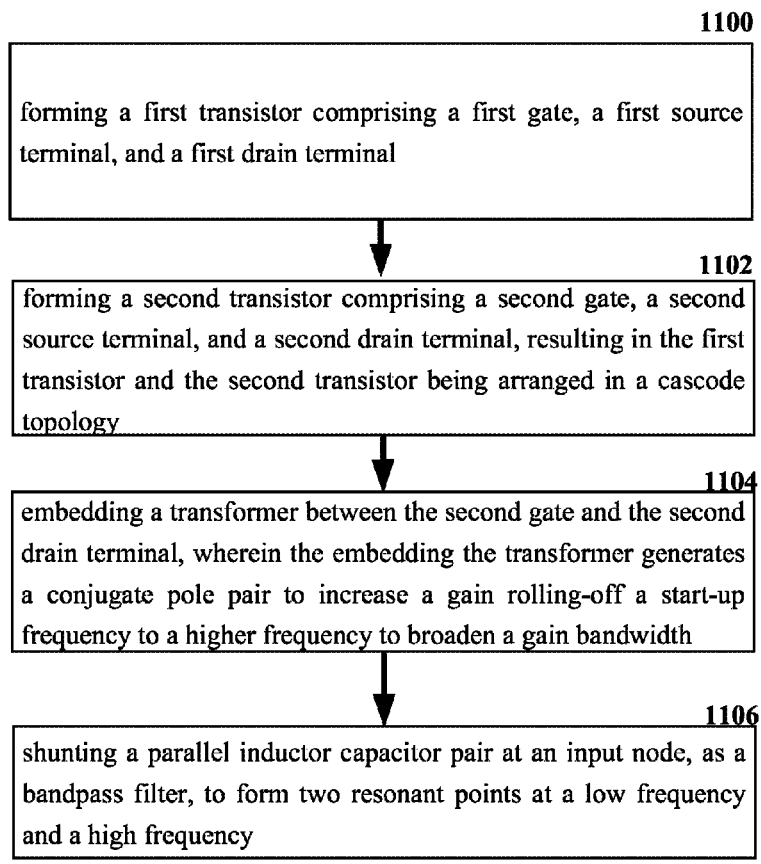
FIG. 11 illustrates an example schematic of a system block diagram of a method for making the viable low noise amplifier with wideband gain response and input matching.

Referring now to FIG. 11, illustrated is an example schematic of a system block diagram of a method for making the low noise amplifier with wideband gain response and wideband input matching. At element 1100, a first transistor can be formed comprising a first gate, a first source terminal, and a first drain terminal. At element 1102, a second transistor can be formed comprising a second gate, a second source terminal, and a second drain terminal, resulting in the first transistor and the second transistor being arranged in a cascode topology. A transformer can be embedded at element 1104 between the second gate and the second drain terminal, wherein the embedding the transformer generates a conjugate pole pair to increase a gain rolling-off a start-up frequency to a higher frequency. The embedding the transformer can also comprise stacking coils on a top metal layer and/or stacking the coils on a sub-top metal layer. Additionally, a resistor can be formed between the transformer and the first drain terminal. At element 1106, parallel inductor capacitor pair can be shunted at an input node as a bandpass filter to form two resonant points at a low frequency and a high frequency. The shunting can comprise a low noise amplifier, wherein the low noise amplifier can comprise a wideband gain response and a wideband input match.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the subject matter has been described herein in connection with various embodiments and corresponding FIGs, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. An apparatus, comprising:
    a first transistor, comprising:
        a first gate;
        a first drain terminal; and
        a first source terminal;
    a second transistor, comprising:
        a second gate;
        a second drain terminal; and
        a second source terminal; wherein the first transistor and the second transistor are arranged in a cascode topology;
    a transformer, wherein the transformer is embedded between the second gate and the second drain terminal of the second transistor;
    an inductor; and
    a capacitor, wherein the inductor and the capacitor form an inductance capacitance pair, wherein the inductor and the capacitor are connected in parallel, wherein the inductance capacitance pair is configured to achieve wideband input matching, and wherein the inductance capacitance pair is located at an input node that is an input terminal associated with the first transistor.

2. The apparatus of claim 1, wherein the inductance capacitance pair is configured to work as a bandpass filter forming two resonant points at low and high frequency.

3. The apparatus of claim 1, wherein the first transistor is an n-type metal-oxide-semiconductor field-effect transistor.

4. The apparatus of claim 3, wherein the second transistor is an n-type metal-oxide-semiconductor field-effect transistor.

5. The apparatus of claim 1, wherein the first transistor is a p-type metal-oxide-semiconductor field-effect transistor.

6. The apparatus of claim 1, wherein the second transistor is a p-type metal-oxide-semiconductor field-effect transistor.

7. An apparatus, comprising:
    a first inductor;
    a capacitor, wherein the first inductor and the capacitor are in parallel resulting in an inductance capacitance pair;
    a first transistor, comprising:
        a first gate;
        a first drain terminal; and
        a first source terminal;
    a second transistor, comprising:
        a second gate;
        a second drain terminal; and
        a second source terminal; wherein the first transistor and the second transistor are arranged in a cascode topology;
    a transformer, comprising:
        a second inductor, wherein the second inductor comprises a first self inductance;
        a third inductor, wherein the third inductor comprises a second self inductance; and
        a mutual inductance comprising a coupling between the first self inductance and the second self inductance; and
    a fourth inductor between the inductance capacitance pair and the first transistor.

8. The apparatus of claim 7, further comprising:
    a first resistor between the fourth inductor and the first transistor.

9. The apparatus of claim 8, further comprising:
    an electrical node, wherein the electrical node comprises the first gate, the fourth inductor, and the first resistor.

10. The apparatus of claim 9, further comprising:
    a second resistor, wherein the second resistor connects the second drain terminal to the second inductor of the transformer.

11. The apparatus of claim 10, further comprising:
    a fifth inductor, where the fifth inductor is connected to the first source terminal.

12. The apparatus of claim 10, wherein the transformer is embedded between the second gate of the second transistor and the second drain terminal of the second transistor.

13. A method, comprising:
    forming a first transistor comprising a first gate, a first source terminal, and a first drain terminal;
    forming a second transistor comprising a second gate, a second source terminal, and a second drain terminal, resulting in the first transistor and the second transistor being arranged in a cascode topology;
    embedding a transformer between the second gate and the second drain terminal, wherein the embedding transformer generates a conjugate pole pair to increase a gain rolling-off a start-up frequency to a higher frequency to broaden a gain bandwidth; and
    shunting a parallel inductor capacitor pair at an input node, as a bandpass filter, to form two resonant points at a low frequency and a high frequency.

14. The method of claim 13, wherein the shunting comprises a low noise amplifier.

15. The method of claim 14, wherein the low noise amplifier comprises a wideband gain response.

16. The method of claim 13, wherein the embedding the transformer comprises stacking coils on a top and a sub-top metal layer.

17. The method of claim 13, further comprising:
    forming a resistor between the transformer and the first drain terminal.

18. The method of claim 14, wherein the low noise amplifier comprises a wideband input match.

19. The method of claim 13, wherein the embedding the transformer comprises stacking coils on a top metal layer.

20. The method of claim 13, wherein the embedding the transformer comprises stacking coils on a top metal layer or a sub-top metal layer.

\* \* \* \* \*